United States Patent
Xu et al.

(10) Patent No.: US 11,756,349 B2
(45) Date of Patent: Sep. 12, 2023

(54) ELECTRONIC CONTROL UNIT TESTING OPTIMIZATION

(71) Applicant: NEC Laboratories America, Inc., Princeton, NJ (US)

(72) Inventors: Jianwu Xu, Titusville, NJ (US); Haifeng Chen, West Windsor, NJ (US)

(73) Assignee: NEC Corporation

( * ) Notice: Subject to any disclaimer, the term of this patent is extended or adjusted under 35 U.S.C. 154(b) by 571 days.

(21) Appl. No.: 17/015,239

(22) Filed: Sep. 9, 2020

(65) Prior Publication Data
US 2021/0078589 A1 Mar. 18, 2021

Related U.S. Application Data

(60) Provisional application No. 62/900,068, filed on Sep. 13, 2019.

(51) Int. Cl.
*G07C 5/08* (2006.01)
*B60W 50/02* (2012.01)
(Continued)

(52) U.S. Cl.
CPC ........ *G07C 5/0808* (2013.01); *B60R 16/0231* (2013.01); *B60W 50/0205* (2013.01);
(Continued)

(58) Field of Classification Search
CPC ......... B60W 50/0205; B60W 60/0027; B60W 60/001; B60W 50/06; G06V 20/20;
(Continued)

(56) References Cited

U.S. PATENT DOCUMENTS 10,551,838 B2 * 2/2020 Liu .................. G01S 7/497
10,853,727 B2 * 12/2020 Kitagawa ........... G05B 23/0254
(Continued)

FOREIGN PATENT DOCUMENTS

WO WO-2019167042 A1 * 9/2019 .............. G06N 3/02

OTHER PUBLICATIONS

Lagaros, Learning improvement of neural networks used in structural optimization, 2002, Elsevier, Advances in Engineering Software 35 (2004), 9-25 (Year: 2002).*
(Continued)

*Primary Examiner* — Elaine Gort
*Assistant Examiner* — Anthony M Gartrelle
(74) *Attorney, Agent, or Firm* — Joseph Kolodka (57) ABSTRACT

A computer-implemented method for implementing electronic control unit (ECU) testing optimization includes capturing, within a neural network model, input-output relationships of a plurality of ECUs operatively coupled to a controller area network (CAN) bus within a CAN bus framework, including generating the neural network model by pruning a fully-connected neural network model based on comparisons of maximum values of neuron weights to a threshold, reducing signal connections of a plurality of collected input signals and a plurality of collected output signals based on connection weight importance, ranking importance of the plurality of collected input signals based on the neural network model, generating, based on the ranking, a test case execution sequence for testing a system including the plurality of ECUs to identify flaws in the system, and initiating the test case execution sequence for testing the system.

20 Claims, 4 Drawing Sheets

(51) Int. Cl.
| | |
|---|---|
| G01R 31/317 | (2006.01) |
| G06N 3/082 | (2023.01) |
| B60W 50/06 | (2006.01) |
| B60W 60/00 | (2020.01) |
| B60R 16/023 | (2006.01) |
| G06N 3/088 | (2023.01) |
| G06V 20/20 | (2022.01) |
| G06V 20/56 | (2022.01) |
| G06F 18/214 | (2023.01) |
| G06N 3/044 | (2023.01) |
| G06N 3/045 | (2023.01) |
| G06V 10/764 | (2022.01) |
| G06V 10/82 | (2022.01) |
| G05D 1/00 | (2006.01) |

(52) U.S. Cl.
CPC .......... *B60W 50/06* (2013.01); *B60W 60/001* (2020.02); *B60W 60/0027* (2020.02); *G01R 31/3172* (2013.01); *G01R 31/31707* (2013.01); *G06F 18/2148* (2023.01); *G06N 3/044* (2023.01); *G06N 3/045* (2023.01); *G06N 3/082* (2013.01); *G06N 3/088* (2013.01); *G06V 10/764* (2022.01); *G06V 10/82* (2022.01); *G06V 20/20* (2022.01); *G06V 20/56* (2022.01); *G06V 20/588* (2022.01); *G05D 1/0088* (2013.01); *G05D 2201/0213* (2013.01)

(58) Field of Classification Search
CPC .. G06V 20/588; G06F 18/2148; G06N 3/045; G06N 3/04; G06N 3/082; G06N 3/088; B60R 16/0231; G01R 31/31707; G01R 31/3172; G07C 5/0808; G05D 1/0088; G05D 2201/0213
See application file for complete search history.

(56) References Cited

U.S. PATENT DOCUMENTS

| | | | | |
|---|---|---|---|---|
| 11,037,005 | B2* | 6/2021 | Li | G05D 1/0246 |
| 2004/0215382 | A1* | 10/2004 | Breed | G01F 23/2962 |
| | | | | 701/45 |
| 2005/0046584 | A1* | 3/2005 | Breed | G01S 7/4802 |
| | | | | 340/13.31 |
| 2007/0005202 | A1* | 1/2007 | Breed | G07C 5/0808 |
| | | | | 714/25 |
| 2008/0284575 | A1* | 11/2008 | Breed | B60N 2/2863 |
| | | | | 701/31.4 |
| 2019/0311262 | A1* | 10/2019 | Nagasaka | F01N 9/00 |

OTHER PUBLICATIONS

Noorossana, An artificial neural network approach to multiple-response optimization, 2009, Int J Adv Manuf Technol (2009) 40:1227-1238 DOI 10.1007/s00170-008-1423-7, 1227-1238 (Year: 2009).*

Ibrahimy, Design and Optimization of Levenberg-Marquardt based Neural Network Classifier for EMG Signals to Identify Hand Motions, 2013, Measurement Science Review, vol. 13, No. 3, 2013 (Year: 2013).*

Garg, Artificial Neural Networks based Methodologies for Optimization of Engine Operations, 2012, International Journal of Scientific & Engineering Research, vol. 3, Issue 5, May 2012 ISSN 2229-5518, 1-5 (Year: 2012).*

Afram, Artificial neural network (ANN) based model predictive control (MPC)and optimization of HVAC systems: A state of the art review and casestudy of a residential HVAC system, 2017, Elsevier, Energy and Buildings 141 (2017) 96-113 (Year: 2017).*

Srinivasan, Neural Networks for Real-Time Traffic Signal Control, 2006, IEEE Transactions on Intelligent Transportation Systems, vol. 7, No. 3, 261-272 (Year: 2006).*

Johansson et al., "Vehicle applications of controller area network", In D. Hristu-Varsakelis and W. S. Levine, Ed., Handbook of Networked and Embedded Control Systems, Birkhauser, Jan. 2005, pp. 1-25.

Conrad et al., "An Extension of the Classification-Tree Method for Embedded Systems for the Description of Events", Electronic Notes in Theoretical Computer Science, vol. 164, Issue 4, Oct. 31, 2006, pp. 3-11.

Fowler et al., "Automating fuzz test generation to improve the security of the Controller Area Network", 2017 ACM Chapters Computer Science in Cars Symposium (CSCS 2017) in Munich, Germany, Jul. 6, 2017, pp. 1-4.

Bringmann et al., "Model-Based Testing of Automotive Systems", 1st International Conference on Software Testing, Verification, and Validation, May 2008, pp. 485-493.

Goodfellow et al., "Deep Learning", MIT Press, Nov. 2016, pp. 1-66.

* cited by examiner

ELECTRONIC CONTROL UNIT TESTING OPTIMIZATION

RELATED APPLICATION INFORMATION

This application claims priority to provisional application Ser. No. 62/900,068, filed on Sep. 16, 2019, incorporated by reference herein in its entirety.

BACKGROUND

Technical Field

The present invention relates to electronic control units (ECUs), and more particularly to ECU testing optimization.

Description of the Related Art

Modern vehicles (e.g., automobiles) can include tens of electronic control units (ECUs). More technologically advanced vehicles such as, e.g., autonomous driving vehicles, may have at least ECUs. ECUs are responsible for much of the functionality of automobiles, including powertrain, vehicle safety, comfort, infotainment and telematics. The software within ECUs is becoming increasingly complex as more functionality is added into ECUs. Accordingly, because ECUs are responsible for a vast array of vehicle functionality, extensive and thorough testing can be needed to ensure proper operation.

SUMMARY

According to an aspect of the present invention, a computer-implemented method is provided for electronic control unit (ECU) testing optimization. The computer-implemented method includes capturing, within a neural network model, input-output relationships of a plurality of ECUs operatively coupled to a controller area network (CAN) bus within a CAN bus framework, including generating the neural network model by pruning a fully-connected neural network model based on comparisons of maximum values of neuron weights to a threshold, reducing signal connections of a plurality of collected input signals and a plurality of collected output signals based on connection weight importance, ranking importance of the plurality of collected input signals based on the neural network model, generating, based on the ranking, a test case execution sequence for testing a system including the plurality of ECUs to identify flaws in the system, and initiating the test case execution sequence for testing the system. The test case execution sequence executes a first test case corresponding to a first collected input signal earlier than a second test case corresponding to a second collected input signal having a lower ranking than the first collected input signal.

According to another aspect of the present invention, a system is provided for electronic control unit (ECU) testing optimization. The system includes a memory device storing program code and at least one processor device operatively coupled to the memory device. The at least one processor device is configured to execute program code stored on the memory device to capture, within a neural network model, input-output relationships of a plurality of ECUs operatively coupled to a controller area network (CAN) bus within a CAN bus framework by generating the neural network model by pruning a fully-connected neural network model based on comparisons of maximum values of neuron weights to a threshold, reduce signal connections of a plurality of collected input signals and a plurality of collected output signals based on connection weight importance, rank importance of the plurality of collected input signals based on the neural network model, generate, based on the ranking, a test case execution sequence for testing a system including the plurality of ECUs to identify flaws in the system, and initiate the test case execution sequence for testing the system. The test case execution sequence executes a first test case corresponding to a first collected input signal earlier than a second test case corresponding to a second collected input signal having a lower ranking than the first collected input signal.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with embodiments of the present invention, systems and methods are provided for electronic control unit (ECU) testing optimization by automatically selecting an optimal set of test cases based on an importance of each individual test case and generating a sequence for execution. More specifically, the optimization can be based on an input-output analysis of ECUs based on neural network modeling for understanding nonlinear relationships that discover the linkage between the input signals into the ECUs and the output measurements. If a combination of input signals does not produce different output measurements, then those test cases with the combination of input signals will be ignored because they fail to generate different output measurement and reveal any new insights. The embodiments described herein can produce equivalent segments of continuous input signals so that any one random sample within the segment will be sufficient to represent this segment for functionality testing. Therefore, the embodiments described herein can produce and select an optimal set of test cases by modeling the input-output relationship for discrete input signals and discovering the equivalent segments for continuous signals. Furthermore, the embodiments described herein can be used to generate the execution sequence based on the importance ranking of input signals. The embodiments described herein can be used to reveal ECU faults at early stages while also reducing the amount of time and/or computational resources spent on testing.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

Each computer program may be tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

As employed herein, the term "hardware processor subsystem" or "hardware processor" can refer to a processor, memory, software or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), field-programmable gate arrays (FPGAs), and/or programmable logic arrays (PLAs).

These and other variations of a hardware processor subsystem are also contemplated in accordance with embodiments of the present invention.

Figure 1:
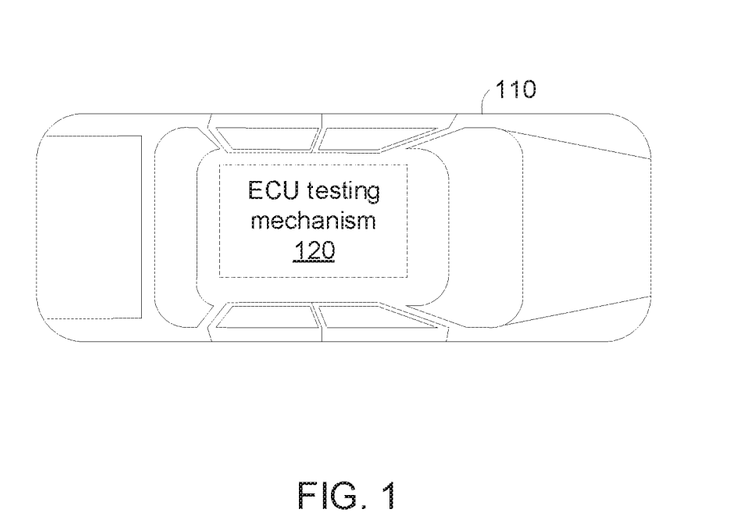
FIG. 1 is a diagram illustrating an exemplary environment configured to implement electronic control unit (ECU) testing optimization, in accordance with an embodiment of the present invention.

Referring now in detail to the figures in which like numerals represent the same or similar elements and initially to FIG. 1, a high-level diagram is provided illustrating an exemplary environment 100. The environment 100 includes a vehicle 110. For example, the vehicle 110 can be an autonomous or self-driving vehicle. In this illustrative embodiment, the vehicle 110 is an automobile and, more particularly, a car. However, the vehicle 110 can be any suitable automobile or other type of vehicle in accordance with the embodiments described herein.

As further shown, the environment 100 includes an electronic control unit (ECU) testing mechanism 120. In this illustrative embodiment, the ECU testing mechanism 120 is located within the vehicle 110. However, in other embodiments, the ECU testing mechanism 120 can be located outside of the vehicle 110 and in communication with the vehicle 110 over a network.

In one embodiment, the ECU testing mechanism 120 is a hardware-in-the-loop (HiL) ECU testing mechanism implementing HiL simulation. In general, HiL simulation refers to a technique in which signals from a controller are fed into to a test system including hardware and/or software that replaces a machine or physical part of a system ("plant"), and provides virtual stimuli that emulates the response of the plant. The test system and the plant can be connected through components such as, e.g., actuators and sensors. For example, in accordance with the embodiments described herein, an HiL ECU testing mechanism replaces an engine with a test system including hardware and/or software that interacts with the ECU. HiL simulation can provide benefits over testing using the plant itself by increasing the scope of testing, providing a safer and lower risk testing environment, enabling compliance with time-to-market restrictions, reducing cost and risk, etc.

As will be described in further detail below with reference to FIG. 2, the ECU testing mechanism 120 can include a plurality of components that use the real ECU hardware in the testing environment and apply the vehicle process model. In this manner, the real ECU hardware is tested for its functionality while a correct vehicle model interacts with the ECU hardware for ease of testing.

Figure 2:
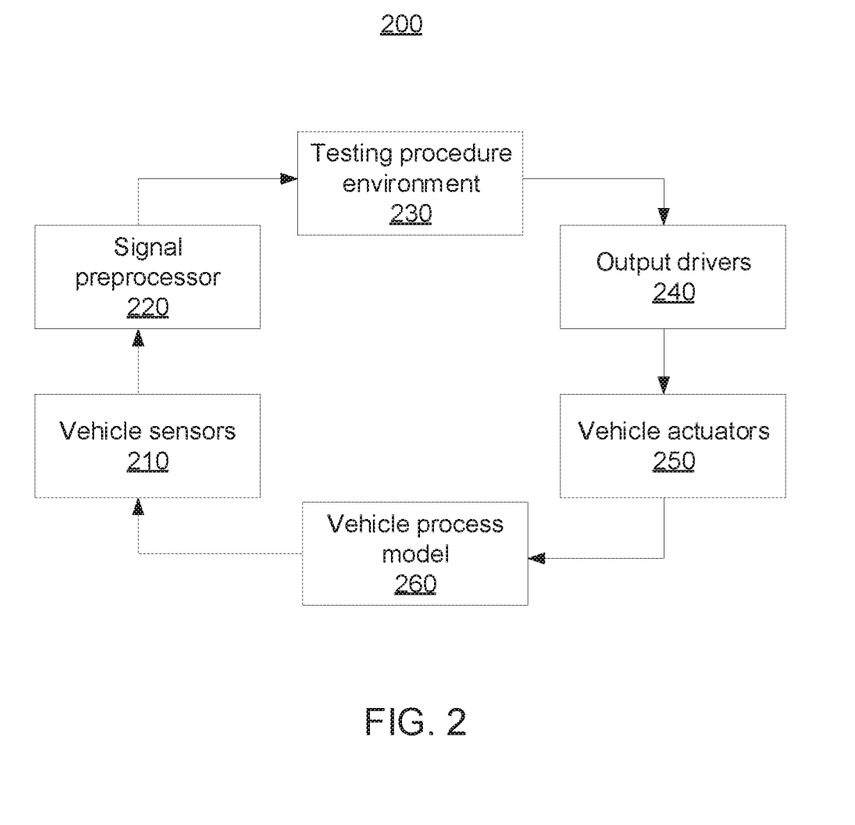
FIG. 2 is a block/flow diagram illustrating a high-level system/method for implementing electronic control unit (ECU) testing optimization, in accordance with an embodiment of the present invention.

Referring now to FIG. 2, a high-level overview of an electronic control unit (ECU) testing mechanism 200 is illustratively depicted in accordance with one embodiment of the present invention. The ECU testing mechanism 200 can be illustratively implemented within the environment described above with reference to FIG. 1 (e.g., ECU testing mechanism 120).

More specifically, in one embodiment, the ECU testing mechanism 200 is a hardware-in-the-loop (HiL) ECU testing mechanism, as described in further detail above with reference to FIG. 1. For example, as shown, ECU testing mechanism 200 can include a plurality of components including vehicle sensors 210, signal conditioner 220, testing procedure environment 230, output drivers 240, vehicle actuators 250, and vehicle process model 260.

The vehicle sensors 210 are in communication with the vehicle process model 260. The vehicle process model 260 simulates the real vehicle process for certain ECU functionalities and generates signals output for the vehicle sensors 210. The sensor signals may include multiple variables corresponding to different sensors.

Once the signals are generated from the vehicle sensors 210, the signals can then be preprocessed by the signal preprocessor 220 to generate preprocessed signals. Preprocessing can include, but is not limited to, signal conditioning, noise removal, outlier detection, outlier removal, etc.

Each preprocessed signal is then passed to the testing procedure environment 230. The testing procedure environment 230 is configured to choose which sensor signals and which range and/or value to use to test an ECU or a group of ECUs working together. The testing procedure environment 230 can also generate the sequence of execution order that will reveal issues or faults as early as possible. Further details regarding the testing procedure environment 230 will be described below with reference to FIG. 3.

The output driver 240s are configured to gather the ECU output and pass the ECU output along to the vehicle actuators 250. The vehicle actuators 250 are configured to receive the feedback from the ECUs about the signals generated from the vehicle process model 260. Based on the feedback, the vehicle actuators 250 can generate signals to cause the vehicle process model 260 to make certain changes and/or measurements. The changes/measurements can then be compared against the desired output to check the correctness of the test.

Figure 3:
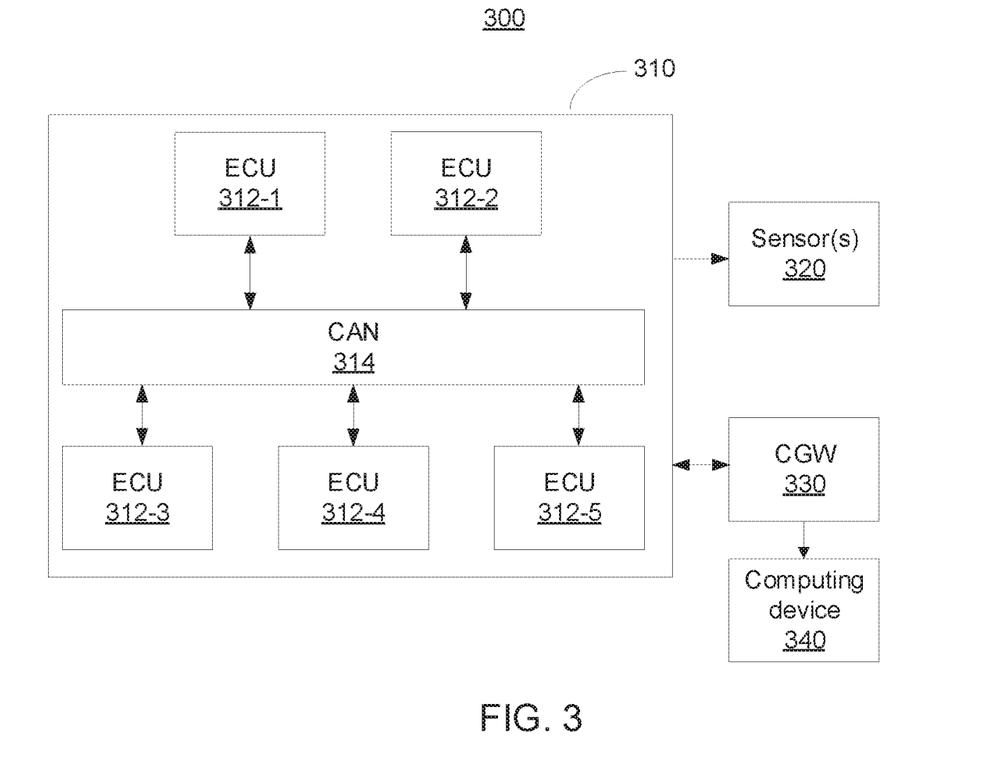
FIG. 3 is a schematic of an electronic control unit (ECU) testing environment, in accordance with an embodiment of the present invention.

Referring now to FIG. 3, a schematic of a testing procedure environment 300 is illustratively depicted in accordance with one embodiment of the present invention. The testing procedure environment can be illustratively implemented within the system described above with reference to FIG. 2 (e.g., testing procedure environment 230).

As shown, the testing procedure environment 300 includes controller area network (CAN) bus system 310 including a plurality of ECU's 312-1 through 312-5 in communication with a CAN bus 314. The number of ECUs shown in the CAN bus framework 310 is for illustrative purposes only and should not be considered limiting. The input and outputs signal of the plurality of ECUs 312-1 through 312-5 are directly linked to the CAN bus 314.

The plurality of ECUs 312-1 through 312-5 can communicate with each other without complex dedicated wiring in between through the CAN bus system 310. More specifically, a CAN-connected ECU can receive messages transmitted from any of the ECUs in the CAN bus system 310. Each individual ECU will decide relevance and act accordingly. If a signal is intended for a particular ECU, then only the particular ECU will respond to the sending signal. Such a design allows easy modification and inclusion of additional nodes.

When it is desired to test certain functionality of the vehicle (e.g., the visual recognition and response subsystem in an autonomous vehicle), multiple ECUs and one or more sensors 320 can be linked through CAN bus 314. For example, the one or more sensors 320 can include one or more cameras. A central gateway (CGW) component 330 is also linked so that signals can be directed to a computing device 340 configured to perform inspection.

Some ECUs have discrete values and other ECUs have continuous values. The procedures that will be described in further detail below with reference to FIG. 4 and FIG. 5 can generate a subset of testing cases for each individual ECU. More specifically, FIG. 4 describes the procedure for the ECUs with discrete values and FIG. 5 explains the procedure for the ECUs with continuous values.

Figure 4:
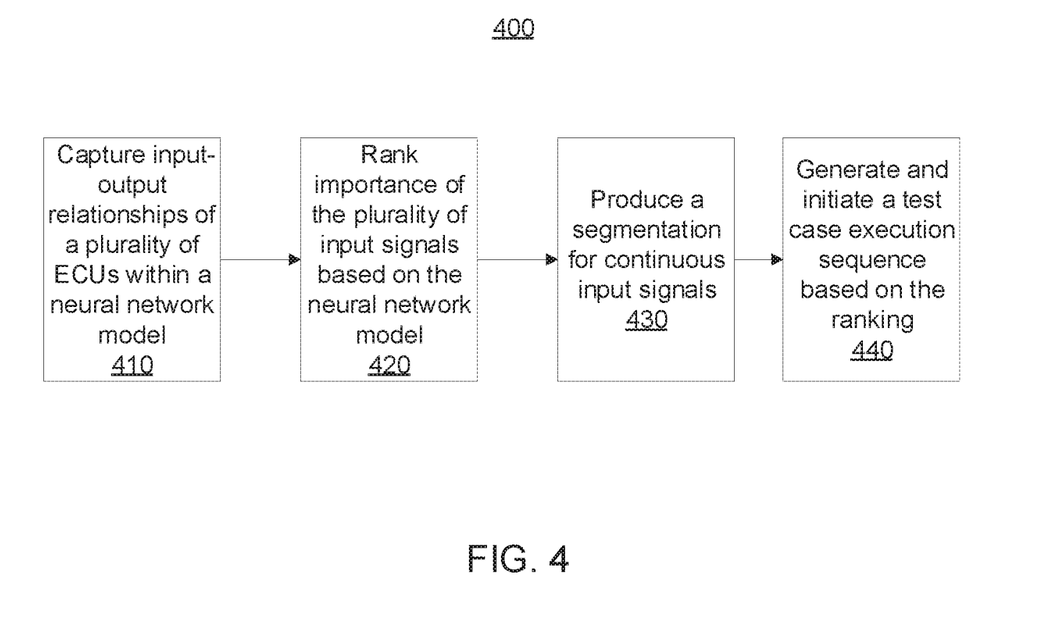
FIG. 4 is a block/flow diagram illustrating a system/method for implementing electronic control unit (ECU) testing optimization, in accordance with an embodiment of the present invention.

Referring now to FIG. 4, a block/flow diagram is provided illustrating a system/method 400 for implementing electronic control unit (ECU) testing optimization. For example, the system/method 400 can be implemented by a testing procedure environment, such as the testing procedure environment 230 of FIG. 2. The system/method 400 can be used to optimize testing of ECUs in, e.g., a vehicle, as described above with reference to FIGS. 1-3. For example, the vehicle can be an autonomous or self-driving vehicle.

At block 410, input-output relationships of a plurality of electronic control units (ECUs) is captured within a neural network model. The plurality of ECUs can be operatively coupled to a controller area network (CAN) bus within a CAN bus framework. For example, capturing the input-out relationships can include generating the neural network model can include collecting a plurality of input signals and a plurality of output signals. Furthermore, signal connections of the plurality of input signals and the plurality of output signals can be reduced based on connection weight importance at block 410.

More specifically, generating the neural network model can including obtaining a fully-connected neural network model corresponding to a deep feed-forward neural network model including an input layer, at least one hidden layer and an output layer. In this embodiment, the number of hidden layers can be set by users. In practice, two hidden layers may be sufficient to quantify the input-output relationship of the plurality of ECUs. Since ECUs are physical systems and exhibit non-linear input-output relationships, a linear model may not be adequate to characterize the input-output relationship of the plurality of ECUs. The training of the deep feed-forward neural network can be performed by a back-propagation gradient descent technique to update neuron weights so that the input-output relationship can be established with reasonable accuracy.

The input-output relationships of the plurality of ECUs can be used to identify the subset of test cases that are representative of the relationship, which should be smaller than the exhaustive combinatorial number. Thus, in one embodiment, generating the neural network model can further include pruning the fully-connected neural network model based on comparisons of maximum values of neuron weights to a threshold. The pruning of the neural network model makes the neural network sparse while maintaining a certain level of accuracy, thereby enabling selection of a small subset of unique test cases with maximum coverage. Accordingly, the neural network model can be obtained to reduce the number of test cases without losing any important or necessary testing input space.

As an illustrative example, for a deep feed-forward neural network model including two hidden layers, the following procedure outlines a pruning process that can generate a neural network model that is sparse and maintains accuracy at a certain predefined level without loss of generalization in accordance with an illustrative embodiment:
1. Train the neural network model until a predetermined accuracy rate is met and for each correctly classified example the condition is satisfied: max absolute sample error $<\eta$, where $\eta$ is a user defined parameter corresponding to a target classification rate.
2. For each $w_l^m$, each $d_h^m$ and each $v_p^m$, and if $$\max_h \max_p |v_p^m d_h^m| < \epsilon$$

then remove $v_p^m$ and $d_h^m$, where $w_l^m$ represents the neuron weight from the input layer of the neural network model to the first hidden layer of the neural network model, $d_h^m$ represents the neuron weight from the first hidden layer to the second hidden layer of the neural network model, $v_p^m$ represents the neuron weight from the second hidden layer to the output layer, the subscripts l, h and p represent weight indices, the superscript m marks the variables as the neuron weights in the neural network model, and $\in$ is a pre-defined threshold having a value between 0 and 1, inclusive. The value $\in$ controls the sparseness and coverage of the final pruned model. More specifically, the higher the value of E, the sparser and less accurate the network model that is generated.
3. For each $v_p^m$ and $d_h^m$, if $\max|v_p^m|<\in$, remove $v_p^m$; if $\max|d_h^m|<\in$, remove $d_h^m$.
4. If no weights satisfy conditions (2) & (3), then remove $w_l^m$ with the smallest $|w_l^m v_p^m d_h^m|$
5. Retrain neural network model; if the classification rates fall below the target $\eta$, stop; otherwise go to step 2.

At block 420, importance of the plurality of input signals is ranked based on the neural network model. As will be described in further detail below, the ranking of the plurality of input signals by importance can be used to generate a test case execution sequence for executing test cases each corresponding to an input signal. More specifically, test cases corresponding to high-ranking input signals may be executed earlier than test cases corresponding to low-ranking input signals.

The following procedure outlines a process that can be used to rank input signal importance based on the neural network model in accordance with an illustrative embodiment:
1. Given the (parsed) neural network model, for each input to hidden layer weight $w_l^m$, compute a product $\Sigma_h \Sigma_p |w_l^m v_p^m d_h^m|$.
2. Sort input nodes in order of the product in ascending order to generate a sorted list.
3. Assign ranks to the inputs according to positions within the sorted list.

As mentioned above, the neural network model generated at block 410 can be used to reduce the number of test cases with discrete input signals. To further reduce the number of test cases for continuous input signals, at block 430, a segmentation for continuous input signals can be produced. More specifically, an input range can be segmented into equivalent groups. For each group, any test case for a specific value within the group can be denoted as a representative test case selected to reduce the total number of test cases. Accordingly, any one random sample within a segment can be sufficient to represent the segment for functionality testing.

As an illustrative example, consider a set of ECUs including ECU 1 and ECU 2 that produce multiple selections of discrete values. For example, ECU 1 can have values of on and off, and ECU 2 can have values of 10, 20 and 30. Each combination of different values for individual ECUs can generate an output value. It is possible that the combination of two ECUs with ECU 1 of value on and ECU 2 of value 10 and 20 can produce very similar output signal values. This indicates that testing cases with 10 and 20 for ECU 2 are redundant. Therefore, we can safely select either 10 or 20 for the ECU 2 when ECU 1 is of value on. However, it is time consuming and labor intensive if this relationship is discovered in a manual approach. FIG. 4 describes an automated procedure to discover this relationship. By going through many different combinations, the system/method of FIG. 4 can collect this set of input and output value pairs. Then, this set of input output value pairs can be used for training the neural network model described in block 410. Since a subset of testing case combinations is selected and ranked while at the same time keeping the coverage of testing, block 420 can prune the neural network model by removing the connections between different neurons. The result will make the neural network model sparse without sacrificing the accuracy.

The system/method of FIG. 4 describes a procedure for discrete input signals. However, ECUs with continuous values may require different approach to further reduce the testing cases. An exemplary procedure that can be used to produce the equivalent segmentation for continuous input signals at block 430 will now be described in further detail below with reference to FIG. 5.

Figure 5:
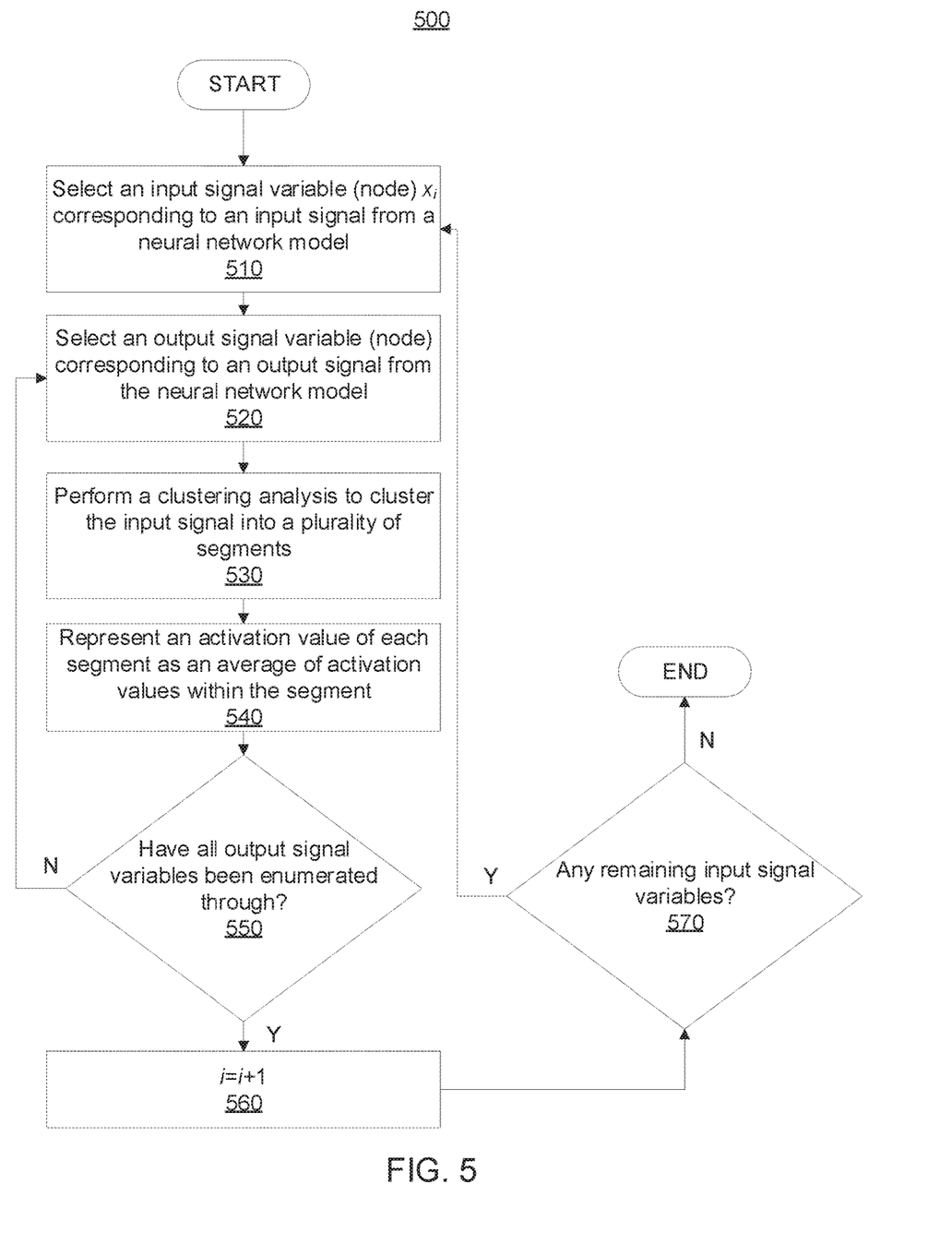
FIG. 5 is a block/flow diagram illustrating equivalent classes segmentation performed by the system/method of FIG. 4, in accordance with an embodiment of the present invention.

Referring now to FIG. 5, a block/flow diagram is provided illustrating a system/method for producing an equivalent segmentation for continuous input signals.

At block 510, an input signal variable (node) $x_i$ corresponding to an input signal is selected from a neural network model. More specifically, the neural network model can be a neural network model modeling a non-linear input-output relationship of a plurality of ECUs. Since there are multiple input signals, the input signal variable is selected one at a time.

At block 520, an output signal variable (node) corresponding to an output signal is selected from the neural network model. Since there are multiple output signals, the output signal variable is selected one at a time.

At block 530, a clustering analysis is performed to cluster the input signal into a plurality of segments. Each of the plurality of segments can be equivalent in terms of testing the relationship between the input signal variable and the output signal variable. More specifically, for the given input signal variable $x_i$ and other remaining input signal variables $x_k$, if both $x_i$ and $x_k$ produce respective output signal variables $y_i$ and $y_k$ and the difference in $y_i$ and $y_k$ is less than a threshold (e.g., $|y_i - y_k| < \mu$ where $\mu$ is the threshold), then $x_i$ and $x_k$ are determined as belonging to the same cluster.

At block 540, an activation value of each segment is represented as an average of activation values within the segment. The activation value determines a representative test case. Therefore, instead of testing the whole range, only a handful of representative test cases need to be selected while maintaining coverage and accuracy.

At block 550, it is determined if all output signal variables have been enumerated through. If not, the procedure will revert back to block 520 to select another output signal variable from the neural network model. If so, the procedure will revert back to block 510 to select another input signal variable from the neural network model.

In an exemplary use case, suppose that ECU 3 can have any value between 10 and 100 representing a sensor reading for pressure. It is not possible to test all values within this range. It is highly possible that any value between 10 and 30 will produce a very close output value, and so on for other ranges. Therefore, any value between 10 and 30 may be sufficient to cover the testing range of 10 and 30. In this approach, the procedure described in FIG. 5 can achieve the goal of reducing the testing cases for the ECUs of continuous values. For example, starting with ECU 3 and one output neuron corresponding to one measurement, given a value of 10 for ECU 3, the value of output measurement is recorded. Then, a next value is experimented with, e.g. 10.5, in an incremental of 0.5, and the output value is measured again. If the two output measurements are within a pre-defined threshold, then the procedure will make a segmentation of between 10 and 10.5 so that any value between 10 and 10.5 will generate the same effect for that particular output measurement. This procedure will continue and enlarge the segment range until the whole range is clustered into non-overlapping segments. Any value inside a segment is a representative for that segment. Therefore, the system/method of FIG. 5 can reduce the required testing cases for ECUs with continuous input values.

Referring back to FIG. 4, at block 440, a test case execution sequence is generated and initiated based on the ranking. The test case execution sequence is used to test a system including the plurality of ECUs to identify flaws in the system. More specifically, a subset of relevant input signal variables sufficient to test the functionality between the input and the given output can be obtained for a given output measurement. Furthermore, a subset of representative test inputs for continuous signals can be generated based on the clustering analysis, thereby reducing the number of test cases. The ranking performed at block 420 offers guidance regarding how to generate the test case execution sequence based on importance. Therefore, instead of testing the whole range, only a subset of representative test cases needs to be selected while maintaining coverage and accuracy.

The system/method 400 automatically selects an optimal set of test cases based on the importance of each individual test case and generate a sequence for execution. If a certain combination of input signals does not produce different output measurements, then those test cases with the combination of input signals will be ignored because they do not generate different output measurement and reveal any new insights. The system/method 400 can produce equivalent segments of continuous input signals so that any one random sample within a given segment will be sufficient to represent the given segment for functionality testing. Therefore, system/method 400 produces an optimal set of testing cases by modeling the input-output relationship for discrete input signals and discovering the equivalent segments for continuous signals, and generates a test case execution sequence based on the importance ranking of input signals.

Figure 6:
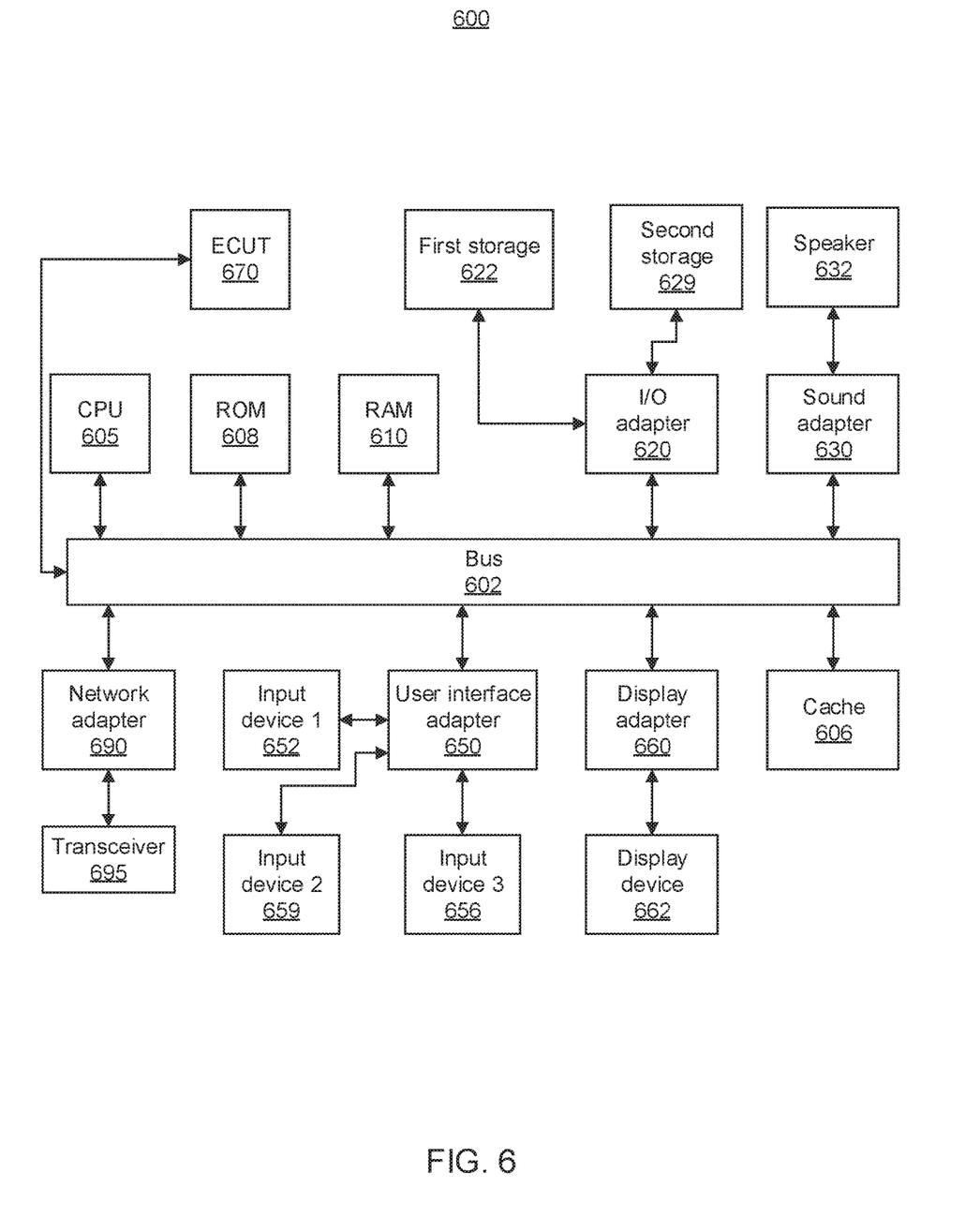
FIG. 6 is a block/flow diagram illustrating a computer system, in accordance with an embodiment the present invention.

Referring now to FIG. 6, an exemplary computer system 600 is shown which may represent a server or a network device, in accordance with an embodiment of the present invention. The computer system 600 includes at least one processor (CPU) 605 operatively coupled to other components via a system bus 602. A cache 606, a Read Only Memory (ROM) 608, a Random-Access Memory (RAM) 610, an input/output (I/O) adapter 620, a sound adapter 630, a network adapter 690, a user interface adapter 650, and a display adapter 660, are operatively coupled to the system bus 602.

A first storage device 622 and a second storage device 629 are operatively coupled to system bus 602 by the I/O adapter 620. The storage devices 622 and 629 can be any of a disk storage device (e.g., a magnetic or optical disk storage device), a solid state magnetic device, and so forth. The storage devices 622 and 629 can be the same type of storage device or different types of storage devices.

A speaker 632 may be operatively coupled to system bus 602 by the sound adapter 630. A transceiver 695 is operatively coupled to system bus 602 by network adapter 690. A display device 662 is operatively coupled to system bus 602 by display adapter 660.

A first user input device 652, a second user input device 659, and a third user input device 656 are operatively coupled to system bus 602 by user interface adapter 650. The user input devices 652, 659, and 656 can be any of a sensor, a keyboard, a mouse, a keypad, a joystick, an image capture device, a motion sensing device, a power measurement device, a microphone, a device incorporating the functionality of at least two of the preceding devices, and so forth. Of course, other types of input devices can also be used, while maintaining the spirit of the present invention. The user input devices 652, 659, and 656 can be the same type of user input device or different types of user input devices. The user input devices 652, 659, and 656 are used to input and output information to and from system 600.

Electronic control unit testing (ECUT) component 670 may be operatively coupled to system bus 602. ECUT component 670 is configured to perform one or more of the operations described above. ECUT component 670 can be implemented as a standalone special purpose hardware device, or may be implemented as software stored on a storage device. In the embodiment in which ECUT component 670 is software-implemented, although shown as a separate component of the computer system 600, ECUT component 670 can be stored on, e.g., the first storage device 622 and/or the second storage device 629. Alternatively, ECUT component 670 can be stored on a separate storage device (not shown).

Of course, the computer system 600 may also include other elements (not shown), as readily contemplated by one of skill in the art, as well as omit certain elements. For example, various other input devices and/or output devices can be included in computer system 600, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the computer system 600 are readily contemplated by one of ordinary skill in the art given the teachings of the present invention provided herein.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment. However, it is to be appreciated that features of one or more embodiments can be combined given the teachings of the present invention provided herein.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended for as many items listed.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A computer-implemented method for implementing electronic control unit (ECU) testing optimization, comprising:
    capturing, within a neural network model, input-output relationships of a plurality of ECUs operatively coupled to a controller area network (CAN) bus within a CAN bus framework, including generating the neural network model by pruning a fully-connected neural network model based on comparisons of maximum values of neuron weights to a threshold;
    reducing signal connections of a plurality of collected input signals and a plurality of collected output signals based on connection weight importance;
    ranking importance of the plurality of collected input signals based on the neural network model; and
    generating, based on the ranking, a test case execution sequence for testing a system including the plurality of ECUs to identify flaws in the system; and
    initiating the test case execution sequence for testing the system, wherein the test case execution sequence executes a first test case corresponding to a first collected input signal earlier than a second test case corresponding to a second collected input signal having a lower ranking than the first collected input signal.

2. The method as recited in claim 1, wherein the plurality of ECUs is associated with an autonomous vehicle.

3. The method as recited in claim 1, further comprising training the neural network model until a predetermined accuracy rate is met and for each correctly classified example at least one condition is satisfied, the at least one condition including a max absolute sample error $<\eta$, wherein $\eta$ is a user defined parameter corresponding to a target classification rate.

4. The method as recited in claim 1, wherein the fully-connected neural network model corresponds to a deep feed-forward neural network model including an input layer, a first hidden layer, a second hidden layer and an output layer, and wherein pruning the fully-collected neural network model further includes:
    for each $w_l^m$, $v_p^m$ and $d_h^m$, determining whether $$\max_h \max_p |v_p^m d_h^m| < \epsilon$$

and removing $v_p^m$ and $d_h^m$ in response to determining that $$\max_h \max_p |v_p^m d_h^m| < \epsilon;$$

for each $v_p^m$, determining whether $\max|v_p^m| < \epsilon$ and removing $v_p^m$ in response to determining that $\max|v_p^m| < \epsilon$;
    for each $d_h^m$, determining whether $\max|d_h^m| < \epsilon$; and removing $d_h^m$ in response to determining that $\max|d_h^m| < \epsilon$; and
    removing $w_l^m$ with a smallest $|w_l^m v_p^m d_h^m|$ in response to failing to find any weights satisfying $$\max_h \max_p |v_p^m d_h^m| < \epsilon,$$

$\max|v_p^m| < \epsilon$, and $|d_h^m| < \epsilon$;
    wherein $w_l^m$ represents a neuron weight from the input layer to the first hidden layer, $d_h^m$ represents a neuron weight from the first hidden layer to the second hidden layer, $v_p^m$ represents a neuron weight from the second hidden layer to the output layer, subscripts l, h and p represent weight indices, superscript m marks the variables as the neuron weights in the neural network model, and E is the threshold having a value between 0 and 1, inclusive.

5. The method as recited in claim 4, wherein ranking the importance of the plurality of input signals further includes:
    computing a product $\Sigma_h \Sigma_p |w_l^m v_p^m d_h^m|$;
    sorting input nodes in order of the product in ascending order to generate a sorted list; and
    assigning ranks according to positions within the sorted list.

6. The method as recited in claim 1, further comprising producing a segmentation for continuous input signals of the plurality of input signals.

7. The method as recited in claim 6, wherein producing the segmentation for continuous input signals further includes:
    selecting an input signal variable corresponding to an input signal from a neural network model;
    selecting an output signal variable corresponding to an output signal from the neural network model;
    performing a clustering analysis to cluster the input signal into a plurality of segments; and
    representing an activation value of each of the plurality of segments as an average of activation values within the segment.

8. A computer program product comprising a non-transitory computer readable storage medium having program instructions embodied therewith, the program instructions executable by a computer to cause the computer to perform a method for implementing electronic control unit (ECU) testing optimization, the method performed by the computer comprising:

capturing, within a neural network model, input-output relationships of a plurality of ECUs operatively coupled to a controller area network (CAN) bus within a CAN bus framework, including generating the neural network model by pruning a fully-connected neural network model based on comparisons of maximum values of neuron weights to a threshold;

reducing signal connections of a plurality of collected input signals and a plurality of collected output signals based on connection weight importance;

ranking importance of the plurality of collected input signals based on the neural network model;

generating, based on the ranking, a test case execution sequence for testing a system including the plurality of ECUs to identify flaws in the system; and initiating the test case execution sequence for testing the system, wherein the test case execution sequence executes a first test case corresponding to a first collected input signal earlier than a second test case corresponding to a second collected input signal having a lower ranking than the first collected input signal.

9. The computer program product as recited in claim 8, wherein the plurality of ECUs is associated with an autonomous vehicle.

10. The computer program product as recited in claim 8, wherein the method further includes training the neural network model until a predetermined accuracy rate is met and for each correctly classified example at least one condition is satisfied, the at least one condition including a max absolute sample error $< \eta$, wherein $\eta$ is a user defined parameter corresponding to a target classification rate.

11. The computer program product as recited in claim 8, wherein pruning the fully-collected neural network model further includes:

for each $w_l^m$, $v_p^m$ and $d_h^m$, determining whether $$\max_h \max_p |v_p^m d_h^m| < \epsilon$$

and removing $v_p^m$ and $d_h^m$ in response to determining that $$\max_h \max_p |v_p^m d_h^m| < \epsilon;$$

for each $v_p^m$, determining whether $\max|v_p^m| < \star$ and removing $v_p^m$ in response to determining that $\max|v_p^m| < \epsilon$;

for each $d_h^m$, determining whether $\max|d_h^m| < \epsilon$; and removing $d_h^m$ in response to determining that $\max|d_h^m| < \epsilon$; and removing $w_l^m$ with a smallest $|w_l^m v_p^m d_h^m|$ in response to failing to find any weights satisfying $$\max_h \max_p |v_p^m d_h^m| < \epsilon,$$

$\max|v_p^m| < \epsilon$, and $|d_h^m| < \epsilon$;

wherein $w_l^m$ represents a neuron weight from the input layer to the first hidden layer, $d_h^m$ represents a neuron weight from the first hidden layer to the second hidden layer, $v_p^m$ represents a neuron weight from the second hidden layer to the output layer, subscripts l, h and p represent weight indices, superscript m marks the variables as the neuron weights in the neural network model, and E is the threshold having a value between 0 and 1, inclusive.

12. The computer program product as recited in claim 11, wherein ranking the importance of the plurality of input signals further includes:

computing a product $\Sigma_h \Sigma_p |w_l^m v_p^m d_h^m|$;

sorting input nodes in order of the product in ascending order to generate a sorted list; and assigning ranks according to positions within the sorted list.

13. The computer program product as recited in claim 8, wherein the method further includes producing a segmentation for continuous input signals of the plurality of input signals.

14. The computer program product as recited in claim 13, wherein producing the segmentation for continuous input signals further includes:

selecting an input signal variable corresponding to an input signal from a neural network model;

selecting an output signal variable corresponding to an output signal from the neural network model;

performing a clustering analysis to cluster the input signal into a plurality of segments; and representing an activation value of each of the plurality of segments as an average of activation values within the segment.

15. A system for implementing electronic control unit (ECU) testing optimization, comprising:

a memory device storing program code; and at least one processor device operatively coupled to the memory device and configured to execute program code stored on the memory device to:

capture, within a neural network model, input-output relationships of a plurality of ECUs operatively coupled to a controller area network (CAN) bus within a CAN bus framework by generating the neural network model by pruning a fully-connected neural network model based on comparisons of maximum values of neuron weights to a threshold;

reduce signal connections of a plurality of collected input signals and a plurality of collected output signals based on connection weight importance;

rank importance of the plurality of collected input signals based on the neural network model;

generate, based on the ranking, a test case execution sequence for testing a system including the plurality of ECUs to identify flaws in the system; and initiate the test case execution sequence for testing the system, wherein the test case execution sequence executes a first test case corresponding to a first collected input signal earlier than a second test case corresponding to a second collected input signal having a lower ranking than the first collected input signal.

16. The system as recited in claim 15, wherein the plurality of ECUs is associated with an autonomous vehicle.

17. The system as recited in claim 15, wherein the at least one processor device is further configured to execute program code stored on the memory device to train the neural network model until a predetermined accuracy rate is met and for each correctly classified example at least one condition is satisfied, the at least one condition including a max absolute sample error $<\eta$, wherein $\eta$ is a user defined parameter corresponding to a target classification rate.

18. The system as recited in claim 15, wherein the at least one processor device is further configured to:
prune the fully-collected neural network model by:
for each $w_l^m$, $v_p^m$ and $d_h^m$, determining whether $$\max_h \max_p |v_p^m d_h^m| < \epsilon$$

and removing $v_p^m$ and $d_h^m$ in response to determining that $$\max_h \max_p |v_p^m d_h^m| < \epsilon;$$

for each $v_p^m$, determining whether $\max|v_p^m|<\bigstar$ and removing $v_p^m$ in response to determining that $\max|v_p^m|<\epsilon$;
for each $d_h^m$, determining whether $\max|d_h^m|<\epsilon$ and removing $d_h^m$ in response to determining that $\max|d_h^m|<\epsilon$; and
removing $w_l^m$ with a smallest $|w_l^m v_p^m d_h^m|$ in response to failing to find any weights satisfying max $\max|v_p^m d_h^m|<\epsilon$, $\max|v_p^m|<\epsilon$, and $|d_h^m|<\epsilon$; and
rank the importance of the plurality of input signals by:
computing a product $\Sigma_h \Sigma_p |w_l^m v_p^m d_h^m|$;
sorting input nodes in order of the product in ascending order to generate a sorted list; and
assigning ranks according to positions within the sorted list;
wherein $w_l^m$ represents a neuron weight from the input layer to the first hidden layer, $d_h^m$ represents a neuron weight from the first hidden layer to the second hidden layer, $v_p^m$ represents a neuron weight from the second hidden layer to the output layer, subscripts l, h and p represent weight indices, superscript m marks the variables as the neuron weights in the neural network model, and E is the threshold having a value between 0 and 1, inclusive.

19. The system as recited in claim 15, wherein the at least one processor device is further configured to execute program code stored on the memory device to produce a segmentation for continuous input signals of the plurality of input signals.

20. The system as recited in claim 19, wherein the at least one processor device is further configured to produce the segmentation for continuous input signals by:
selecting an input signal variable corresponding to an input signal from a neural network model;
selecting an output signal variable corresponding to an output signal from the neural network model;
performing a clustering analysis to cluster the input signal into a plurality of segments; and
representing an activation value of each of the plurality of segments as an average of activation values within the segment.

* * * * *